(12) United States Patent
Yamada et al.

(10) Patent No.: US 9,254,635 B2
(45) Date of Patent: Feb. 9, 2016

(54) TAPE ADHERING DEVICE AND TAPE ADHERING METHOD

(75) Inventors: Shingo Yamada, Yamanashi (JP); Kozo Odawara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 190 days.

(21) Appl. No.: 13/995,257

(22) PCT Filed: Nov. 29, 2011

(86) PCT No.: PCT/JP2011/006649
§ 371 (c)(1),
(2), (4) Date: Jun. 18, 2013

(87) PCT Pub. No.: WO2012/086132
PCT Pub. Date: Jun. 28, 2012

(65) Prior Publication Data
US 2013/0269870 A1 Oct. 17, 2013

(30) Foreign Application Priority Data
Dec. 24, 2010 (JP) ................................. 2010-287295

(51) Int. Cl.
*B32B 38/00* (2006.01)
*B65H 35/00* (2006.01)
(Continued)

(52) U.S. Cl.
CPC ........ *B32B 38/0004* (2013.01); *B65H 35/0013* (2013.01); *B65H 37/002* (2013.01); *H01L 21/67132* (2013.01); *H01L 24/743* (2013.01); *G02F 1/1303* (2013.01); *H01L 24/27* (2013.01); *H01L 2224/27436* (2013.01);
(Continued)

(58) Field of Classification Search
CPC .............. B32B 38/004; B65H 35/0013; H01L 21/67132; H01L 24/743; Y10T 156/12; Y10T 156/1062
USPC .......................... 156/256, 268, 510, 516, 517
See application file for complete search history.

(56) References Cited

U.S. PATENT DOCUMENTS 5,766,402 A * 6/1998 Muraoka et al. .............. 156/361
2011/0186235 A1* 8/2011 Muraoka et al. .............. 156/538

FOREIGN PATENT DOCUMENTS

CN  101035729 A  9/2007
CN  101277588 A  10/2008
(Continued)

OTHER PUBLICATIONS

International Search Report for PCT/JP2011/006649 dated Dec. 27, 2011.
Chinese Office Action for Application No. 201180062359.6 dated May 5, 2015.

*Primary Examiner* — Mark A Osele
*Assistant Examiner* — Christopher C Caillouet
(74) *Attorney, Agent, or Firm* — Pearne & Gordon LLP

(57) ABSTRACT

The pressing tool and the ACF tape cutting device are linked and connected with each other by a link device, and the forcing member is caused to move relatively towards and away from the knife member by lifting up and down the pressing tool so as to form a cut. By allowing the tool lifting device to double as a drive device for causing the forcing member to move relatively towards and away from the knife member, the necessity of the actuator of the ACF tape cutting device which is needed in the related art tape adhering device can be obviated.

4 Claims, 10 Drawing Sheets

(51) Int. Cl.
 *B65H 37/00* (2006.01)
 *H01L 21/67* (2006.01)
 *H01L 23/00* (2006.01)
 *G02F 1/13* (2006.01)

(52) U.S. Cl.
 CPC ............... *H01L 2224/743* (2013.01); *H01L 2224/83192* (2013.01); *Y10T 156/1062* (2015.01); *Y10T 156/12* (2015.01)

(56) References Cited

FOREIGN PATENT DOCUMENTS

| | | |
|---|---|---|
| JP | 2001-294361 A | 10/2001 |
| JP | 2003-023241 A | 1/2003 |
| JP | 2008-150144 A | 7/2008 |
| JP | 2008-192728 A | 8/2008 |
| WO | 2010084728 A1 | 7/2010 |

\* cited by examiner

TAPE ADHERING DEVICE AND TAPE ADHERING METHOD

TECHNICAL FIELD

The present invention relates to a tape adhering device and a tape adhering method for adhering an ACF tape which is made up of an anisotropic conductive film to a target adhering location on a substrate such as a liquid crystal panel.

BACKGROUND ART

In a module production process for producing modules such as liquid crystal panels, a tape adhering device is used which adheres a tape which is made up of an anisotropic conductive film abbreviated to ACF (Anisotropic Conductive Film) (hereinafter, referred to as an ACF tape) to plural electrodes provided to be aligned in one direction on an upper surface of a substrate such as a liquid crystal panel. The ACF tape is supplied in the form of a tape member in which the ACE tape is integrated with a protection tape called a separator which is attached to one side thereof.

The tape adhering device includes a base and a substrate holding unit. The base includes a pressing tool (hereinafter, also referred to as a tool), a tool lifting device for lifting up and down the tool, a tape conveyor device for conveying a tape member, and an ACF tape cutting device (hereinafter, also referred to as a cutting device) for cutting an ACF tape adhered to a separator so as to form a cut piece of ACF tape on the separator (for example, Patent Literature 1).

The cutting device includes a pressing member and a knife member which are provided to face each other across the tape member held therebetween, whereby the ACF tape is cut by a blade of the knife member by reciprocating the pressing member relative to the knife member so as to form a cut piece of ACF tape on the separator. Then, electrodes which are provided to be aligned in one direction of an edge portion of a substrate which is held on the substrate holding unit and the ACF tape are registered with each other. Then, by lifting the tool down to the ACF tape the cut pieces of ACE tape are adhered on to the electrodes on the substrate. The substrate to which the cut pieces of ACE tape are adhered in the way described above is then sent to a downstream stage, in which stage electronic parts mounting work is performed in which electronic parts such as flexible circuit boards are mounted on the ACE tape.

RELATED ART LITERATURE

Patent Literature

Patent Literature 1: J P-A-2001-294361

SUMMARY OF THE INVENTION

Problem to be Solved by the Invention

In the related art tape adhering device, however, an actuator such as an air cylinder or a motor is necessary to reciprocate the pressing member relative to the knife member of the cutting device, and a feeding circuit for the actuator also needs to be provided on the base. This causes a problem that the construction on the base side becomes complex and the production cost is increased.

In this invention, it is object to provide a tape adhering device and tape adhering method in which the necessity of the actuator of the ACF tape cutting device can be obviated.

A tape adhering device of one aspect of the present invention, comprises a pressing tool, a tool lifting device for lifting up and down the pressing tool, a tape conveyor device for conveying a tape member in which a separator is adhered to one side of an ACF tape in a horizontal direction in an area lying directly below the pressing tool and conveying the tape member in a vertical direction in an area lying to a side of the pressing tool, an ACE tape cutting device made up of a forcing member and a knife member which are provided to face each other across the tape member which is conveyed in the vertical direction and configured so that the forcing member is forced to press against the separator so as to form a cut in the ACF tape by a blade of the knife member, and a substrate holding unit for holding a substrate and positioning an electrode on an edge portion of the substrate below the pressing tool; wherein the pressing tool and the ACE tape cutting device are linked and connected with each other by a link device, and the forcing member is caused to move relatively towards and away from the knife member by lifting up and down the pressing tool so as to form a cut.

In a tape adhering device of one aspect of the present invention, wherein the knife member is a fixed knife and the forcing member is a swing member which is disposed at a portion lying to a side of the pressing tool and which swings about a pin; the link device is made up of a cam portion provided on the swing member and an abutment member provided on the pressing tool side, and the forcing member is caused to move relatively towards and away from the blade of the knife member as a result of the abutment member being lifted up and down along the cam portion while being linked with the lifting up and down of the pressing tool so as to form the cut.

In the tape adhering device of one aspect of the present invention, a separating member is provided on the swing member which is adapted to swing together with the swing member so as to separate the ACF tape adhered to the blade of the knife member from the blade in forming the cut.

A tape adhering method of one aspect of the present invention including a pressing tool, a tool lifting device for lifting up and down the pressing tool, a tape conveyor device for conveying a tape member in which a separator is adhered to one side of an ACF tape in a horizontal direction in an area lying directly below the pressing tool and conveying the tape member in a vertical direction in an area lying to a side of the pressing tool, an ACF tape cutting device made up of a forcing member and a knife member which are provided to face each other across the tape member which is conveyed in the vertical direction and configured so that the forcing member is forced to press against the separator so as to form a cut in the ACF tape by a blade of the knife member, a substrate holding unit for holding a substrate and positioning an electrode on an edge portion of the substrate below the pressing tool, and an ACF tape cutting device which is linked with the pressing tool by a link device, the tape adhering method comprising causing the forcing member to move relatively towards and away from the knife member while being linked with the lifting up and down of the pressing tool so as to form the cut; then conveying relatively a cut piece of ACF tape formed on the separator by the cut so formed to a position lying above the electrode on the edge portion of the substrate which is held by the substrate holding unit thereon, and adhering the cut piece on to the electrode by causing the pressing tool to be lifted down and up.

Advantage of the Invention

In the invention, the pressing tool is driven to be lifted up and down by the tool lifting device so that the cut piece of ACF tape on the separator of the tape member is pressed against the target adhering location on the substrate so as to be adhered thereto by the pressing tool. Then, a predetermined location of the tape member is located in the position where the predetermined location faces the blade of the knife member, and when the tool lifting device is driven to lift up and down the tool in that state, the forcing member is caused to move relatively towards and away from the knife member while being linked with the lifting up and down of the tool and forces the ACF tape against the blade of the knife member so as to form a cut piece of ACE tape. Then, the pressing tool presses the cut piece against the electrode on the edge portion of the substrate so as to adhere the cut piece to the electrode. Thus, as has been described above, by allowing the tool lifting device to double as a drive device for causing the forcing member to move relatively towards and away from the knife member, the necessity of the actuator of the ACF tape cutting device which is needed in the related art tape adhering device can be obviated.

BRIEF DESCRIPTION OF THE DRAWINGS

FIG. 1 is a front view of a tape adhering device according to an embodiment of the invention.

FIG. 2 is a side view of the tape adhering device according to the embodiment of the invention.

FIG. 3 is a perspective view of a part of the tape adhering device according to the embodiment of the invention where a pressing tool is provided.

FIG. 4 is an exploded view of an ACF tape cutting device of the tape adhering device according to the embodiment of the invention.

FIG. 5 is a perspective of the ACF tape cutting device of the tape adhering device according to the embodiment of the invention which is now built up.

FIG. 6 is a block diagram of a control system of the tape adhering device according to the embodiment of the invention.

MODE FOR CARRYING OUT THE INVENTION

Figure 1:
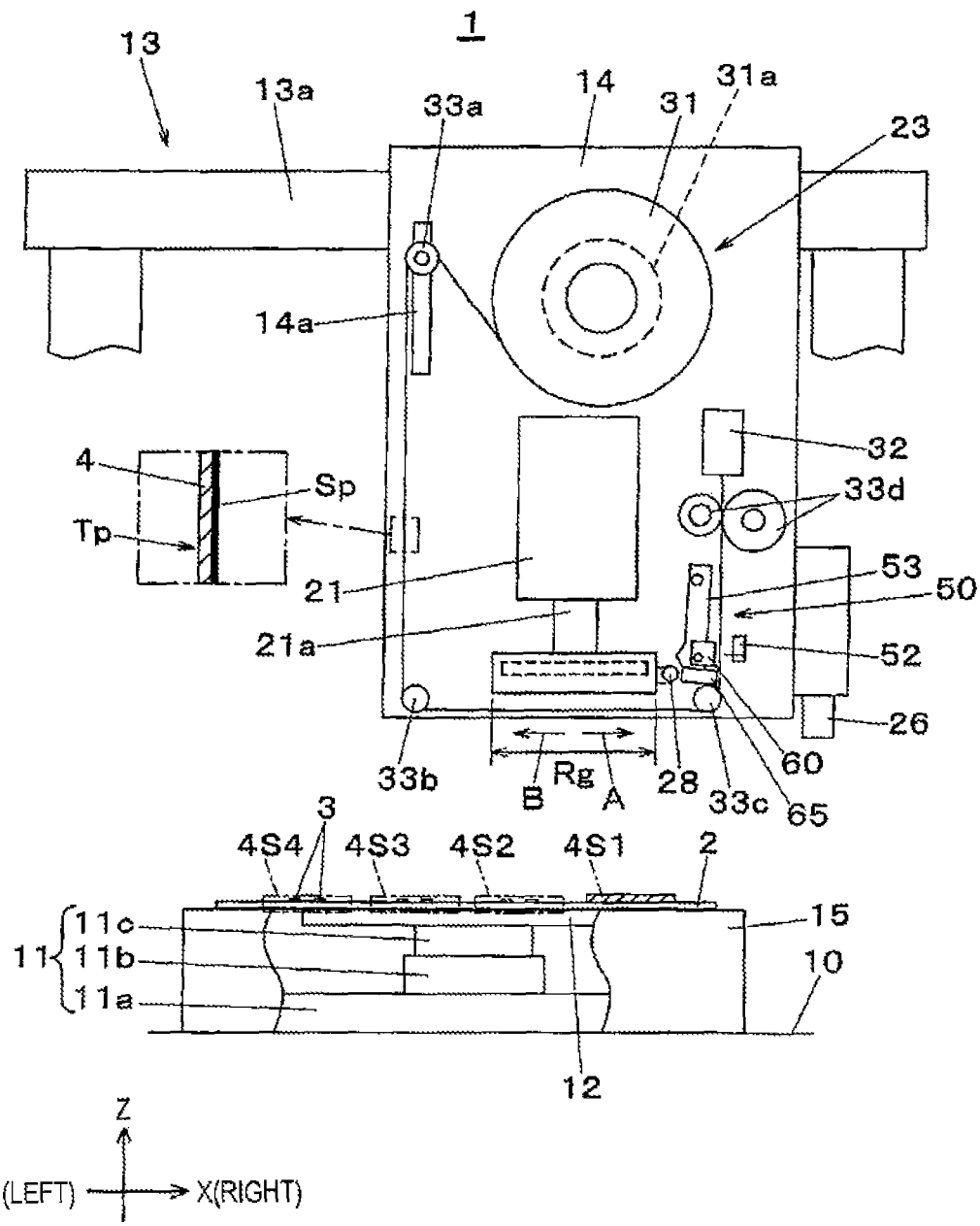
[FIG. 1]

Hereinafter, an embodiment of the invention will be described by reference to the drawings. A tape adhering device 1 shown in FIGS. 1 and 2 constitutes a liquid crystal panel production line together with an electrode washing system which is disposed upstream thereof and a pre-bonding system and a main bonding system which are disposed downstream thereof. The tape adhering device 1 receives a substrate 2 which is a liquid crystal panel substrate from the electrode washing system disposed upstream thereof, adheres cut pieces 4S (4S1 to 4S4) of tape (ACF tape 4) which is made up of an anisotropic conductive film called ACF (Anisotropic Conductive Film) to plural electrodes 3 which are provided along an edge portion of an upper surface of the substrate 2, and then delivers the substrate 2 to the pre-bonding system disposed downstream thereof. In this embodiment, the ACF tape 4 is supplied in the form of a tape member Tp to one side of which a separator Sp which is a protection tape is adhered (refer to an enlarged view in FIG. 1). The plural cut pieces 4S1 to 4S4 are sequentially adhered to the electrodes 3 on the substrate 2 in a horizontal row through steps that will be described later.

Figure 2:
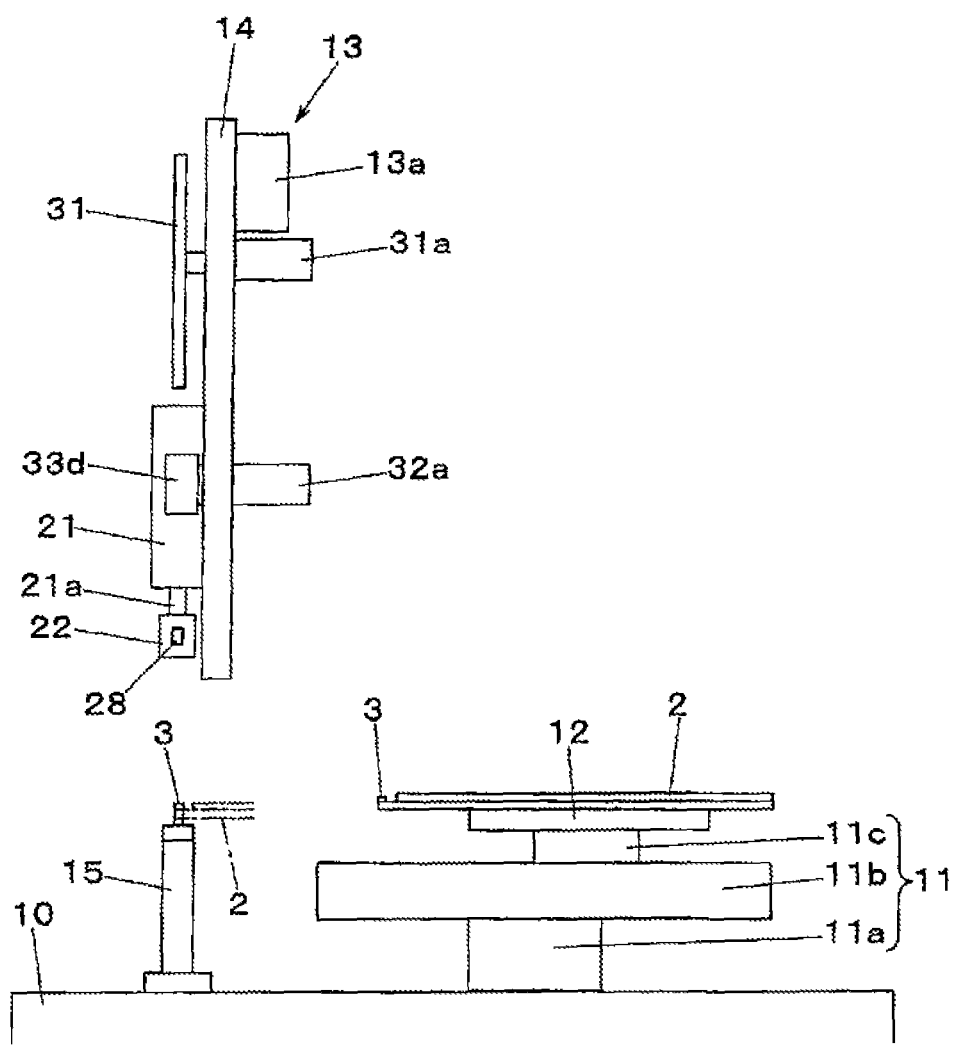
[FIG. 2]

In FIGS. 1 and 2, the tape adhering device 1 includes a base platform 10 and a table-like substrate holding unit 12 which holds the substrate 2 in a horizontal posture so that the electrodes 3 are oriented upwards and which is moved by a substrate holding unit moving mechanism 11 which is provided on the base platform 10. Additionally, the tape adhering device 1 includes a portal frame 13 which is provided on the base platform 10 and which has a horizontal frame 13*a* which extends in a horizontal direction, a plate-shaped base 14 which is mounted on the horizontal frame 13*a* so as to be positioned above the substrate holding unit 12 and which is provided movably along the horizontal frame 13*a* (that is, in the horizontal direction) and a plate-shaped back-up stage 15 which is provided on the base platform 10 so as to extend in a direction in which the base 14 moves. Hereinafter, the horizontal direction in which the horizontal frame 13*a* extends (in which the base 14 moves) is referred to as a transverse direction of the tape adhering device 1, which is then referred to as an X-axis direction, and a horizontal direction which intersects the X-axis direction at right angles which is referred to as a longitudinal direction of the tape adhering device, which is then referred to as a Y-axis direction. Additionally, a vertical direction is referred to as a Z-axis direction. Further, in the transverse direction (the X-axis direction), a left-hand side of a sheet of paper on which FIG. 1 is drawn is referred to as left, and a right-hand side of the sheet of paper on which FIG. 1 is drawn is referred to as right. In the longitudinal direction (the Y-axis direction), a left-hand side of a sheet of paper on which FIG. 2 is drawn is referred to as front, and a right-hand side of the sheet of paper on which FIG. 2 is drawn is referred to as rear.

In FIGS. 1 and 2, the substrate holding unit moving mechanism 11 has an X-axis table 11*a* which can freely move in the transverse direction (the X-axis direction) with respect to the base platform 10, a Y-axis table 11*b* which can freely move in the longitudinal direction (the Y-axis direction) with respect to the X-axis table 11*a*, and a θ table 11*c* which is provided on the Y-axis table 11*b* and which can freely rotate about the Z-axis. The substrate holding unit 12 is mounted on an upper surface of the θ table 11*c*. Because of this, the substrate holding unit 12 can be moved inwards on a horizontal plane by the X-axis table 11*a* moving in the transverse direction (the X-axis direction), the Y-axis table 11*b* moving in the longitudinal direction (the Y-axis direction) and the θ table 11*c* rotating about the vertical axis (the Z axis).

In FIGS. 1 and 2, a tool lifting cylinder 21, a pressing tool 22 which is provided to be lifted up and down freely relative to the base 14 by the tool lifting cylinder 21, a tape conveyor unit 23, an image capturing camera 26, and an ACF tape cutting device 50 are provided on a front surface of the base 14.

Figure 3:
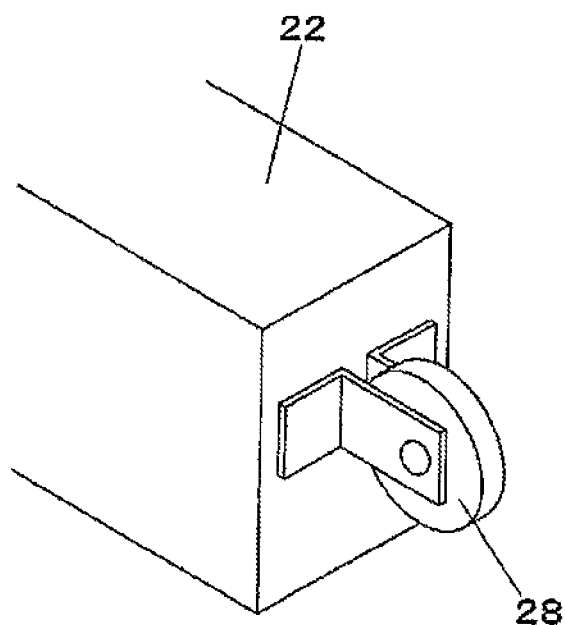
[FIG. 3]

In FIGS. 1 and 2, the tool lifting cylinder (the tool lifting device) 21 is provided at a central portion on the front surface of the base 14 with a piston rod 21*a* oriented downwards. The pressing tool 22 is mounted at a lower end of the piston rod 21*a*. When the piston rod 21*a* of the tool lifting cylinder 21 is caused to project downwards or is withdrawn upwards, the pressing cylinder 22 is lifted down or up. A heater 22a (FIG. 1) is provided inside the pressing tool 22 for heating the pressing tool 22. Additionally, a roller 28, which is an abutment member which is brought into abutment with a cam portion 53b (which will be described later), is mounted on a lateral surface of the pressing tool 22 (also, refer to FIG. 3). The back-up state 15 supports an edge portion of a substrate 2 against which the pressing tool 22 is pressed from therebelow.

In FIGS. 1 and 2, the tape conveyor unit 23 includes a supply reel 31 for supplying the tape member Tp, a tape recovering portion 32 which recovers the tape member Tp which is supplied by the supply reel 31 by means of vacuum suction, and plural guide rollers which guide the tap member Tp from the supply reel 31 to the tape recovering portion 32. The guide rollers include a first guide roller 33a, a second guide roller 33b, a third guide roller 33c and a pair of fourth guide rollers 33d. The supply reel 31 is driven by a supply reel drive motor 31a which is provided on a rear surface of the base 14. The pair of fourth guide rollers 33d is a tape feeding device and is driven by a tape recovering portion drive mechanism 32a which is provided on the rear surface of the base 14.

In FIG. 1, the first guide roller 33a moves freely within a roller moving groove 14a which is formed so as to extend in a vertical direction at an upper left-hand side portion of the base 14 and is biased upwards by a biasing member, not shown. The second guide roller 33b is provided below the first guide roller 33a at a lower left-hand side portion of the base 14. The third guide roller 33c is provided to the right of the second guide roller 33b at a lower right-hand side of the base 14. The pair of fourth guide rollers 33d are provided above the third guide roller 33c at a right-hand side portion of the base 14 so as to be aligned side by side in a transverse direction of the base 14.

In FIG. 1, the tape member Tp which is supplied from the supply reel 31 is guided sequentially by the first guide roller 33a, the second guide roller 33b, the third guide roller 33c and the pair of fourth guide rollers 33d in that order and is sent to the tape recovering portion 32. Here, in the pair of fourth guide rollers 33d, the tape member Tp is held therebetween from the transverse direction on both sides thereof.

An appropriate tension is imparted to the tape member Tp by the first guide roller 33a being biased upwards within the roller moving groove 14a and is held and conveyed in a posture in which the tape member Tp extends in the vertical direction over a left-hand side area of the base 14 between the first guide roller 33a and the second guide roller 33b. Additionally, the tape member Tp is held and conveyed in a posture in which the tape member Tp extends horizontally in the transverse direction (the X-axis direction) over a lower side area of the base 14 between the second roller 33b and the third roller 33c (with the pressing tool 22 situated in a raised position). In addition, the tape member Tp is held and conveyed in a posture in which the tape member Tp extends in the vertical direction over a right-hand side area of the base 14 between the third guide roller 33c and the pair of fourth guide rollers 33d and between the pair of fourth guide rollers 33d and the tape recovering portion 32.

The tape conveyor unit 23 can convey the tape member Tp in a forward direction (a direction in which the tape member Tp flows from left to right over an area Rg lying directly below the pressing tool 22, that is, a direction indicated by an arrow A in FIG. 1) by feeding out the tape member Tp from the supply reel 31 while sucking in the tape member Tp by the tape recovering portion 32. Additionally, the tape conveyor unit 32 can convey (reversely backwards) the tape member Tp in a reversely backward direction (a direction in which the tape member Tp flows from right to left over the area Rg lying directly below the pressing tool 22, that is, a direction indicated by an arrow B in FIG. 1) by taking up the tape member Tp by the supply reel 31 while sucking in the tape member Tp by the tape recovering portion 32.

Namely, in the embodiment, the tape conveyor unit 23 is provided on the base 14 and functions as a tape conveying device which conveys the tape member Tp forwards and reversely backwards in the horizontal direction which is a direction parallel to the moving direction (the X-axis direction) of the base 14 in the area Rg lying directly below the pressing tool 22.

The image capturing camera 26 is provided at a lower right-hand side portion of the base 14 with an image capturing field of view thereof oriented downwards. The image capturing camera 26 moves together with the base 14 when the base 14 moves in the horizontal direction so as to capture images of both end portions of a cut piece 4S of ACF tape 4. By so ding, whether or not a tape adherence is done successfully can be verified.

Figure 4:
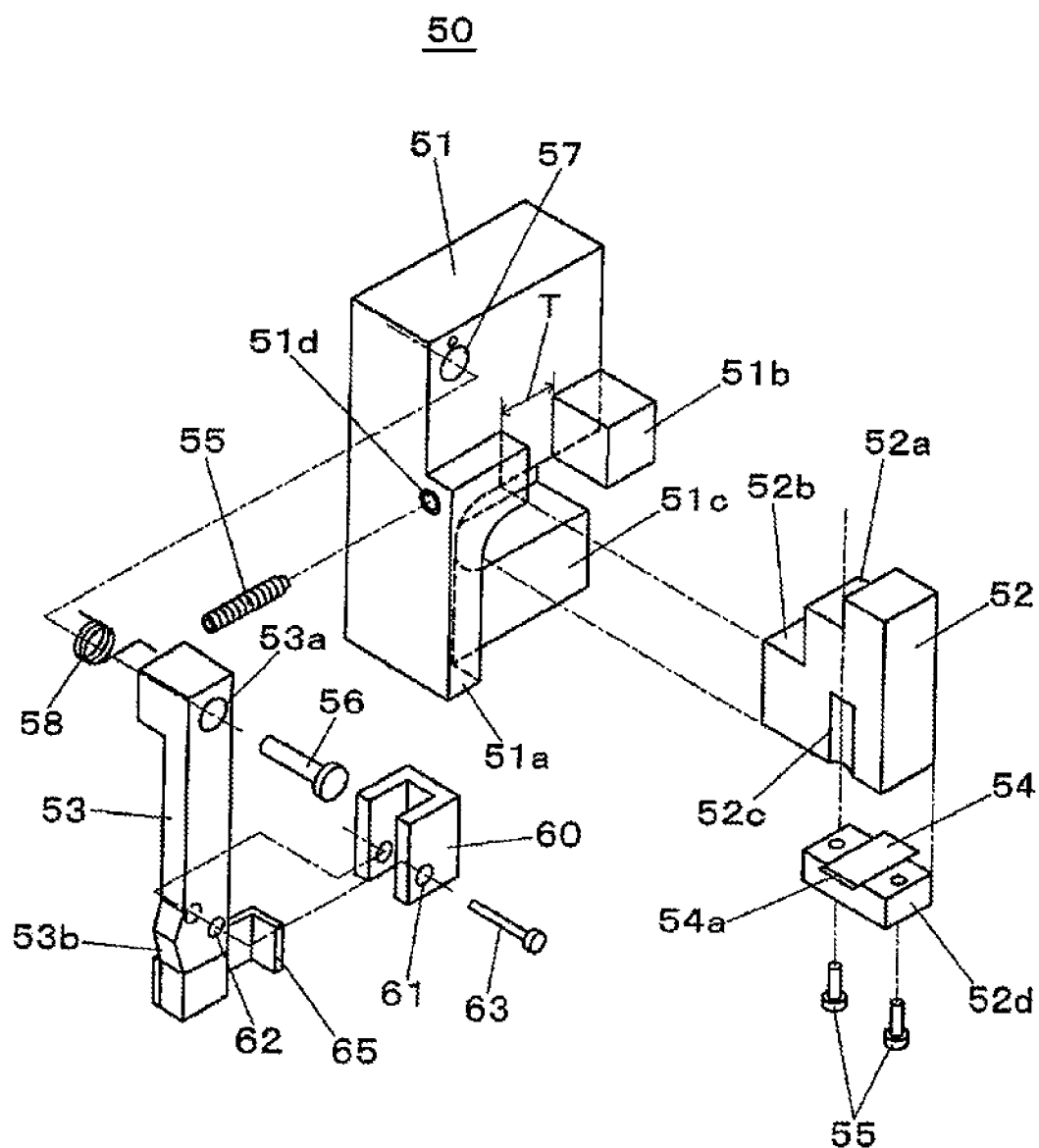
[FIG. 4]
Figure 5:
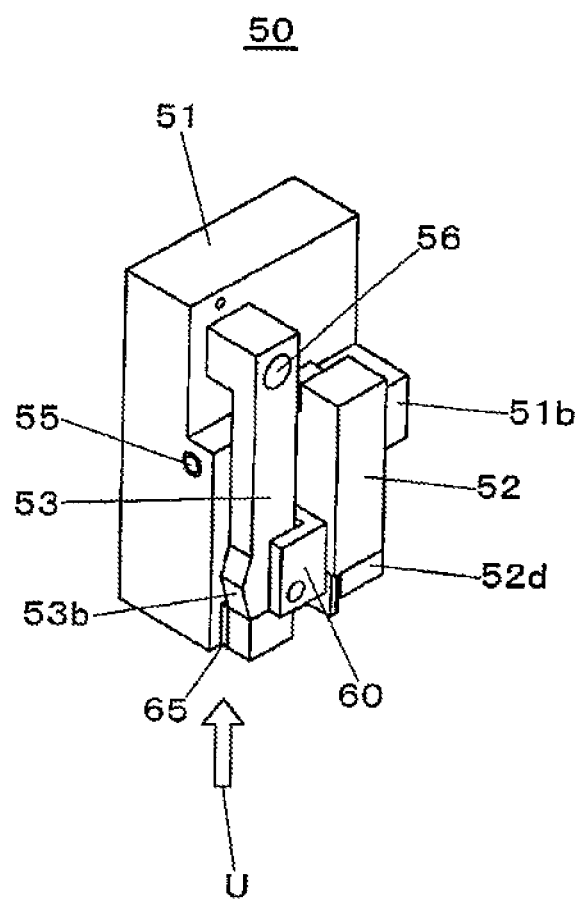
[FIG. 5]

In FIG. 1, the ACE tape cutting device 50 is provided to a side of the pressing tool 22 on the base 14. Next, referring to FIGS. 1, 4 and 5, the ACF tape cutting device 50 will be described. FIG. 4 is an exploded perspective view of the ACF tape cutting device, and FIG. 5 is a perspective view of the ACF tape cutting device which is now built up. The ACF tape cutting device 50 is formed by assembling a first member 52 and a second member 53 to a block-shaped main body portion 51. A first projecting portion 51a is provided at a lower portion of one side portion on a front surface of the main body portion 51 so as to project therefrom. Additionally, a second projecting portion 51b is provided at the other side portion on the front surface so as to project therefrom. A space T is ensured between the projecting portion 51a and the projecting portion 51b. In addition, a third projecting portion 51c is provided at a lower portion of the main body portion 51 so as to project therefrom. Step portions 52a, 52b as in a set of stairs are formed at a front shoulder portion of the first member 52. Additionally, a relief recess portion 52c is formed into a vertical groove-like shape at a lower portion on an inner surface of the first member 52. A lower block 52d is secured to a lower surface of the first member 52 with plungers 55 with a fixed knife 54 as a knife member held therebetween. As shown in FIG. 5, the first member 52 is assembled to the main body portion 51 by being inserted into the space T so as to rest on the third projecting portion 51c. The plungers 55 are screwed into hole portions 51b formed in the first projecting portion 51a so that distal ends of the plungers 55 are pressed against a lateral surface of the first member 52, whereby the first member 52 is fixed to the main body portion 51.

The second member 53 has a vertically elongated lever-like shape. A pin 56 is inserted in a hole 53a formed in an upper end portion, so that the pin 56 is securely inserted in a hole 57 formed in an upper side portion of the main body portion 51, whereby the second member 53 is mounted on the main body portion 51 so as to swing freely about the pin 56. A spring material 58 is mounted on the pin 56. The spring material 58 is situated between the main body portion 51 and the second member 53 to bias the second member 53 in a clockwise direction (in a direction in which a lower end portion thereof moves away from the fixed knife 54) in FIG. 5. Namely, the second member 53 is a swing member which swings relative to a blade 54a of the fixed knife 54 about the pin 56 disposed at an upper portion thereof.

In FIGS. 4, 5, a forcing member 60 having a U-shaped section is mounted on a lower portion of the second member 53. The forcing member 60 is mounted on the lower portion of the second member 53 by inserting a pin 63 in a hole 61 formed in the forcing portion 60 and a hole 62 formed in the lower portion of the second member 53. In a built-up state shown in FIG. 4, the forcing member 60 faces the blade 54a of the fixed knife 54.

In FIG. 4, a separating member 65, which has an L-shaped hook-like configuration as viewed from the top thereof, is mounted on a lateral surface of a lower end portion of the second member 53. Additionally, the angular cam portion 53b is formed on a lateral surface (a surface facing the pressing tool 22) of the second member 53. As will be described later, the roller 28 provided on the lateral surface of the pressing tool 22 is lifted up and down along the cam portion 53b, whereby the second member 53 swings about the pin 56, which causes the forcing member 60 to move towards and from the fixed knife 54. Then, as will be described later, the forcing member 60 forces the ACE tape 4 of the tape member Tp against the blade 54a of the fixed knife 54 so as to form a cut K (which will be described later) in the ACE tape 4. Namely, the second member 53 is a forcing member which forces the ACE tape 4 against the fixed knife 54. Thus, as has been described above, the roller 28 and the cam portion 53b constitute a linking device which links the cutting operation of the ACE tape cutting device 50 with the lifting-up and lifting-down actions of the pressing tool 22. Namely, when the pressing tool 22 is lifted up and down, the roller 28 is lifted up and down along the cam portion 53b, whereby the second member (the swing member, the forcing member) 53 is caused to move towards and away from the blade 54a of the fixed knife 54 so as to form a cut K in the ACE tape 4.

Figure 6:
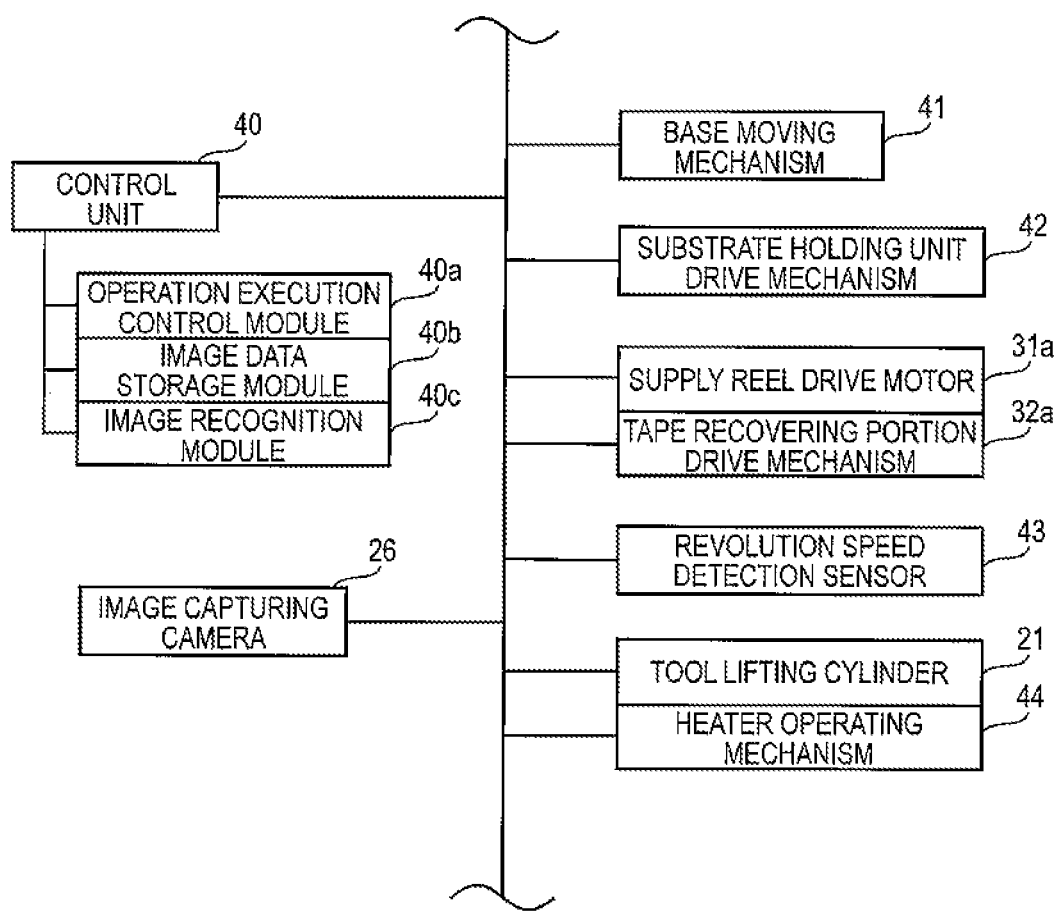
[FIG. 6]

The movement of the base 14 in the X-axis direction (the transverse direction) with respect to the horizontal frame 13a of the portal frame 13 in FIG. 1 is executed as a result of an operation execution control module 40a of a control unit 40, that is included in the tape adhering device 1, controlling the operation of a base moving mechanism 41 (a movable base moving device) which is made up of an actuator, not shown, in FIG. 6.

In FIG. 6, the movement of a substrate 2 held on the substrate holding unit 12 is executed as a result of the operation execution control module 40a of the control unit 40 controlling the operation of a substrate holding unit drive mechanism 42 which is made up of an actuator, not shown. The conveyance of the tape member Tp by the tape conveyor unit 23 is executed as a result of the operation execution control module 40a of the control unit 40 controlling the operations of the pair of fourth guide rollers 33d, a supply reel drive motor 31a and a tape recovering portion drive mechanism 32a. A position of a leading portion of the ACF tape 4 of the tape member Tp is calculated from information on the revolution speed of one of the pair of fourth guide rollers 33d which is detected by a revolution speed detection sensor 43 and data on a radius of the one of the pair of fourth guide rollers 33d.

The lifting up and down of the pressing tool 22 is executed as a result of the operation execution control module 40a of the control unit 40 controlling the operation of the tool lifting cylinder 21. In addition, the heating of the pressing tool 22 by the heater 22a provided in an interior of the pressing tool 22 is executed as a result of the operation execution control module 40a of the control unit 40 controlling the operation of a heater operating mechanism 44.

The control of image capturing operation by the image capturing camera 26 is executed by the operation execution control module 40a of the control unit 40. Image data captured by the image capturing camera 26 is stored in an image data storage module 40b of the control unit 40, and an image recognition module 40c which receives an instruction from the operation execution control module 40a executes an image recognition based on the image data stored in the image data storage module 40b.

In this embodiment, the base 14 is made into a moving frame which moves horizontally along the horizontal frame 13a. However, a configuration may be adopted in which the base is made into a fixed base, a substrate is held on a movable table, and the substrate is moved in the horizontal direction relative to the base. Namely, the base may only have to move in the transverse direction relative to the substrate.

Next, by use of explanatory diagrams depicting steps of tape adhering work in FIGS. 7(a) to (c), 8(a) to (c), and 9(a), (b), an execution procedure will be described for executing a series of operations (of the tape adhering work) of adhering cut pieces 4S1 to 4S4 of ACF tape 4 into a horizontal row on electrodes on an edge portion which is a target adhering location on the substrate 2 by the tape adhering device 1.

Figure 7:
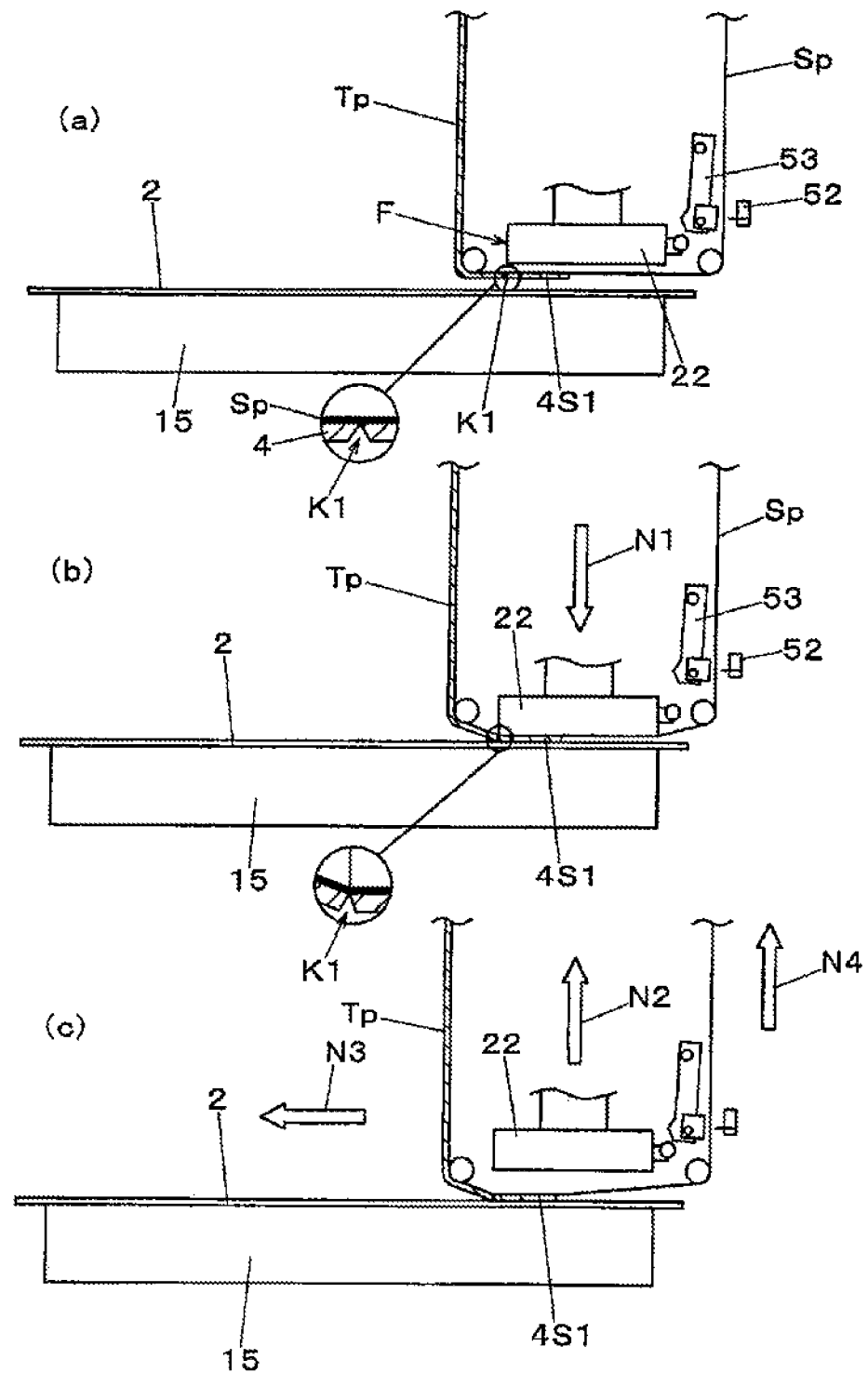
[FIG. 7] FIGS. 7(*a*), (*b*) and (*c*) are explanatory diagrams depicting steps of tape adhering work executed by the tape adhering device according to the embodiment of the invention.
Figure 8:
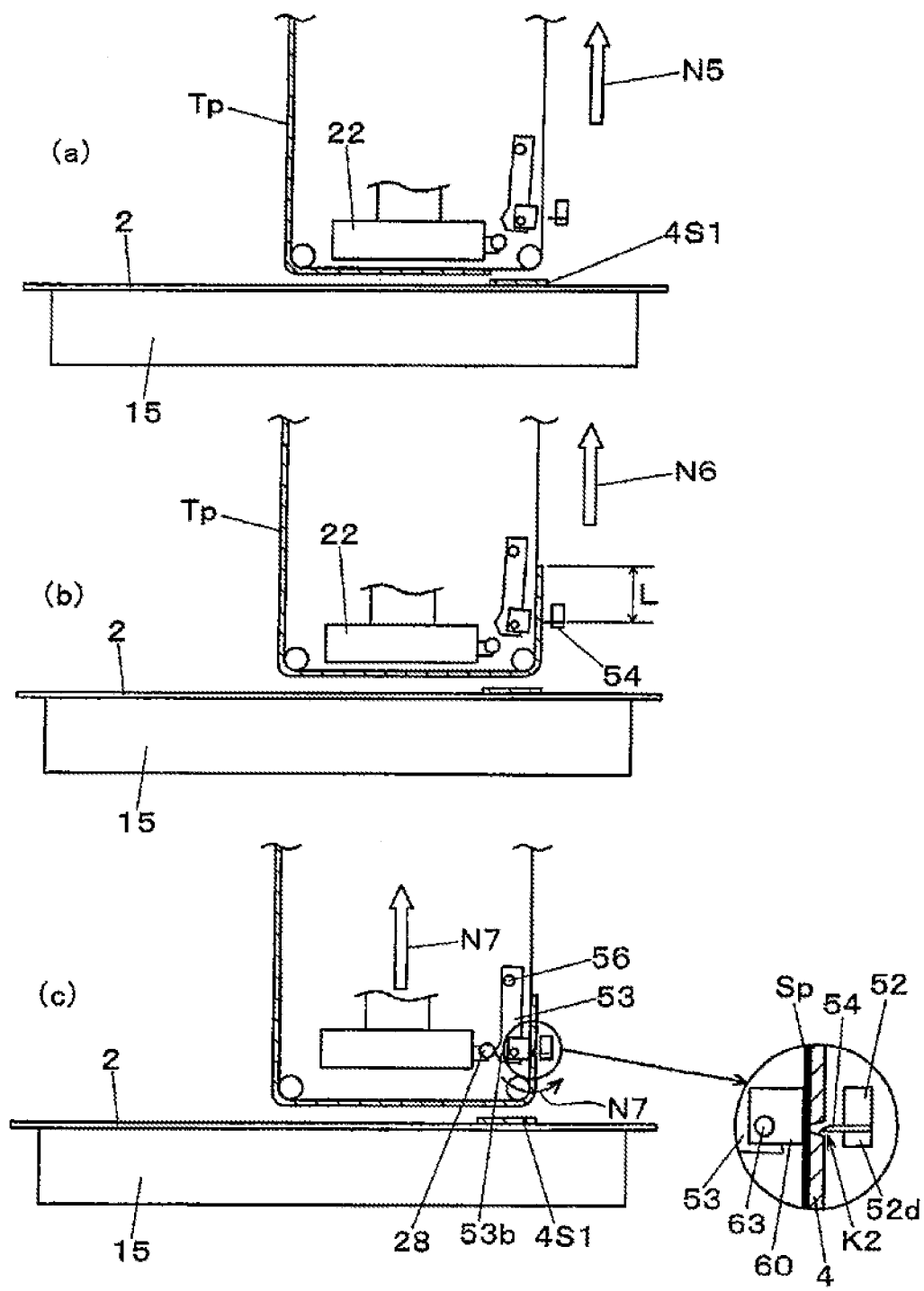
[FIG. 8] FIGS. 8(*a*), (*b*) and (*c*) are explanatory diagrams depicting steps of the tape adhering work executed by the tape adhering device according to the embodiment of the invention.

FIG. 7(a) shows a state in which after a cut K1 is formed in the ACF tape 4 on the separator by the fixed knife 54 of the ACE tape cutting device 50 in the previous step, the tape member Tp is conveyed reversely so that a cut piece 4S1 of ACE tape 4 is positioned above an electrode 3 on the substrate 2 on the substrate holding unit 12 so as to be registered with the electrode 3. In this state, an upstream end face F of the pressing tool 22 is aligned with the position of the cut K1 in the ACE tape 4.

Then, as shown in FIG. 7(b), the pressing tool 22 is caused to descend so that the first cut piece 4S1 is pressed against the electrode 3 on the substrate 2 (an arrow N1), and following this, as shown in FIG. 7(c), the pressing tool 22 is lifted up (an arrow N2). When the lower surface of the pressing tool 22 moves away from the cut piece 4S1 as a result of the pressing tool 22 being so lifted up, the base 14 starts to move leftwards in FIG. 7(c) (an arrow N3), and the tape conveyor unit 23 conveys the tape member Tp in the forward direction (an arrow N4). Then, the separator Sp is separated from an upper surface of the cut piece 4S1 which is adhered to the substrate 2. FIG. 8(a) shows a state in which the leftward movement of the base 14 and the conveyance of the tape member Tp in the forward direction are completed. In this state, the tape member Tp is conveyed in the forward direction (an arrow N5), whereby a fresh ACF tape 4 on the tape member Tp is fed out to the area lying below the lower surface of the pressing tool 22.

Next, as shown in FIG. 8(b), the tape member Tp is conveyed by a predetermined amount in the forwarding direction (an arrow N6). Then, the tape member Tp rises vertically between the fixed knife 54 and the forcing member 60, and the conveyance of the tape member Tp is stopped at a point in time when a predetermined location of the tape member Tp is positioned in a position where the location faces the blade 54a of the fixed knife 54, that is, a point in time when the tape member Tp is conveyed further upwards than the fixed knife 54 by a length of a cut piece 4S.

Then, as shown in FIG. 8(c), the pressing tool 22 is lifted up further (an arrow N7). Then, the roller 28 which is integrated with the pressing tool 22 is also lifted up. During the roller 28 being so lifted up, the roller 28 is brought into abutment with the cam portion 53b, and the second member 53 swings in a counterclockwise direction about the pin 56 against the spring force of the spring material 58. Then, the forcing member 60 mounted at the lower portion of the second member 53 moves forwards relative to the fixed knife 54, and the tape member Tp is forced towards the fixed knife 54 by the forcing member 60, whereby a cut K2 is formed in the ACF tape 4 by the fixed knife 54 so as not to reach the separator Sp.

Figure 9:
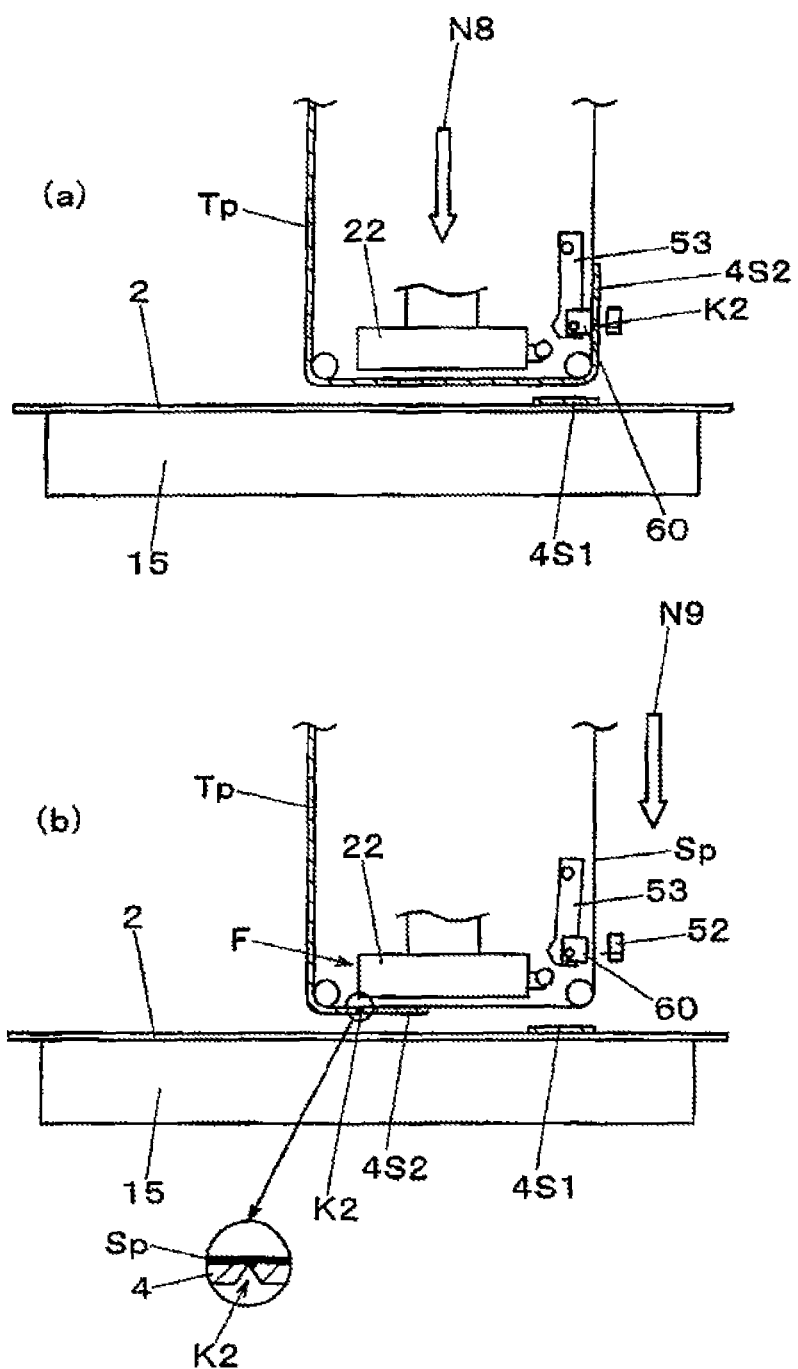
[FIG. 9] FIGS. 9(*a*) and (*b*) are explanatory diagrams depicting steps of the tape adhering work executed by the tape adhering device according to the embodiment of the invention.

Next, when the pressing tool 22 is caused to descent as shown in FIG. 9(a) (an arrow N8), the roller 28 also descends along the cam portion 53b and then moves away from the cam portion 53b to a position therebelow. Then, the second member 53 swings in the clockwise direction about the pin 56 by the spring force of the spring material 58 (FIG. 4), and the forcing member 60 moves away from the tape member Tp. Thus, as shown in FIG. 9(a), the cut K2 and a second cut piece 4S2 are formed on the separator Sp. Consequently, the second member 53 which is the swing member functions as a forcing member which forces the forcing member 60 against the cutting edge of the fixed knife 54. A configuration may be adopted in which the forcing member is fixed, and the fixed knife is made into a movable knife, so that the movable knife is linked with the lifting-up and lifting-down actions of the pressing tool 22 so as to move towards and away from the forcing member, whereby a cut can be formed in the ACE tape. Additionally, the ACE cutting device can be disposed on a left-hand side of the pressing tool 22 in FIG. 1.

Next, as shown in FIG. 9(b), the tape conveyor unit 23 conveys the tape member Tp reversely (an arrow N9), so that the cut piece 4S2 is positioned above the next adhering location where the ACE tape is adhered to the substrate 2. FIG. 9(b) shows the initial state shown in FIG. 7(a) (the cut K coincides with the end face F of the pressing tool 22), whereafter the series of operations that has been described above is repeated whereby cut pieces 4S3, 4S4 shown in FIG. 1 are sequentially adhered to the substrate 2. Thus, following the same procedure, the third and following cut pieces 4S3, 4S4 are adhered to electrodes on the substrate 22.

In this embodiment, while the lifting-up and lifting-down actions of the pressing tool 22 are described as being executed by the tool lifting cylinder 21, the invention is not limited thereto. Alternatively, the tool lifting device may be formed by a combination of a motor and a feed screw so as to facilitate the control of the position of the pressing tool 22.

Next, referring to FIGS. 10(a) to (d), the operation of the separating member 65 will be described. As will be described hereinbelow, this separating member 65 is designed to separate the ACF tape 4 adhered to the blade of the fixed knife 54 from the blade when forming a cut K in the ACF tape 4 by pressing the tape member Tp against the blade of the fixed knife 54 by the forcing member 60.

Figure 10:
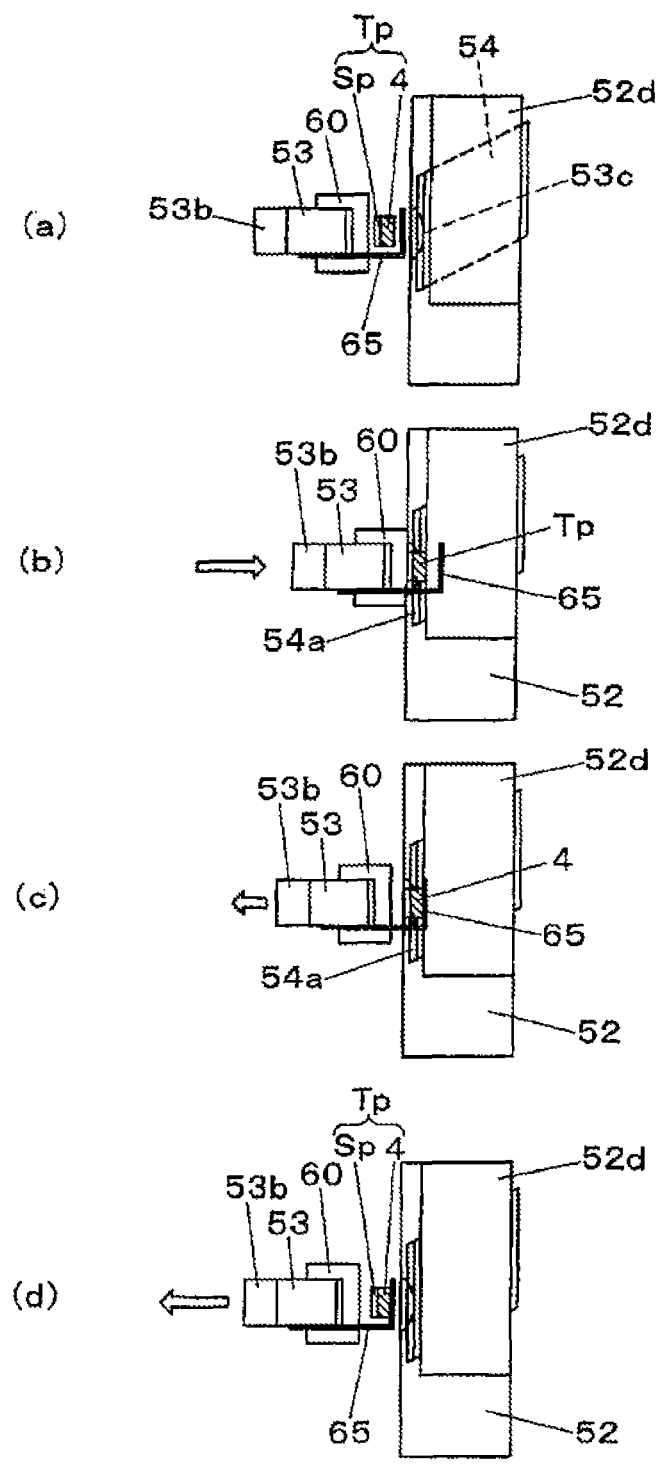
[FIG. 10] FIGS. 10(*a*), (*b*), (*c*) and (*d*) are explanatory diagrams depicting operations of a separating member of the tape adhering device according to the embodiment of the invention.

FIGS. 10(a) to (d) are views resulting when the ACF tape cutting device 50 is viewed from therebelow (in a direction indicated by an arrow U in FIG. 5) and are shown in an operating order of the separating member 65. FIG. 10(a) shows the timing (the state in which the tape member Tp is conveyed further upwards than the fixed knife 54 by a predetermined length) shown in FIG. 8. In this state, the tape member Tp is situated between the fixed knife 54 and the second member 53, and the L-shaped separating member 65 which extends from the second member 53 towards the fixed knife 54 is disposed with a space defined between the tape member Tp and itself.

FIG. 10(b) shows the timing (the timing at which the ACF tape 4 is forced against the blade of the fixed knife 54 by the forcing member 60 to form the cut K2) shown in FIG. 8(c).

The FIGS. 10(c), (d) show steps in which the second member 53 is displaced from the state in FIG. 8(c) to the state in FIG. 9(a). When the roller 28 starts to be lifted down, the second member 53 starts to swing in the clockwise direction about the pin 56, whereby the separating member 65 comes into contact with the AFC tape 4 adhered to the blade of the fixed knife 54 (FIG. 10(c)). When the roller 28 is lifted down further, the second member 53 swings further, whereby the separating member 65 separates the ACF tape 4 adhered to the blade of the fixed knife 54 from the blade (FIG. 10(d)). As this occurs, a tension is imparted to the ACF tape 4, and therefore, the ACF tape 4 separates from the separating member 65, whereby the state in FIG. 10(a) is restored. Thus, when the separating member 65 shifts from the state in FIG. 10(b) to the state in FIG. 10(d), the ACF tape 4 adhered to the blade 54a of the fixed knife 54 is forced to be separated from the blade by the separating member 65.

It is desirable that a material to which an adhesive tape is difficult to be adhered is used for the separating member 65 in order to prevent the re-adherence of the ACE tape 4 to the separating member 65.

As has been described above, in the embodiment, the pressing tool 22 is linked with the ACE tape cutting device 50 via the cam portion (the link device) 53b, whereby the second member (the forcing member) 53 is caused to move relatively towards and away from the fixed knife (the knife member) 54 by lifting up and down the pressing tool 22 so as to form the cut K. When this occurs, the tool lifting cylinder (the tool lifting device) 21 is made to double as a driving device for causing the second member 53 to move relatively towards and away from the fixed knife 54, whereby the actuator of the ACF tape cutting device which is necessary in the related art tape adhering device can be made unnecessary.

It will also fall within the scope of the invention for those skilled in the art to alter or modify the invention variously based on the description of the specification and the known techniques without departing from the spirit and scope of the invention, and the alterations or modifications so made also fall within the scope to be protected. Additionally, the constituent elements in the embodiment may be combined arbitrarily without departing from the spirit and scope of the invention.

This patent application is based on Japanese Patent Application (No. 2010-287295) filed on Dec. 24, 2010, the contents of which are incorporated herein by reference.

Industrial Applicability

According to the invention, the cut pieces of ACF tape can be formed while obviating the necessity of the actuator of the ACF tape cutting device which is necessary in the related art tape adhering device so as to be adhered to the electrodes on the edge portion of the substrate. Therefore, the overall construction of the tape adhering device can be simplified, and the production cost of the tape adhering device can also be reduced, and hence, the invention is particularly important in the module production process for producing a module like a liquid crystal panel.

DESCRIPTION OF REFERENCE NUMERALS AND SIGNS

1 Tape adhering device
2 Substrate
3 Electrode
4 ACF tape
4S (4S1 to 4S4) Cut piece
12 Substrate holding unit
14 Base
21 Tool lifting cylinder (Tool lifting device)
22 Pressing tool
23 Tape conveyor unit (Tape conveyor device)
28 Roller (Abutment member, Link device)
41 Base moving mechanism 50 ACF tape cutting device
53b Cam portion (Link device)
Separating member
K (K1, K2) Cut
Sp Separator
Tp Tape member
Rg Area lying directly below pressing tool

The invention claimed is:

1. A tape adhering device, comprising:
a pressing tool;
a tool lifting device for lifting up and down the pressing tool;
a tape conveyor device for conveying a tape member in which a separator is adhered to one side of an ACF tape in a horizontal direction in an area lying directly below the pressing tool and conveying the tape member in a vertical direction in an area lying to a side of the pressing tool;
an ACF tape cutting device made up of a forcing member and a knife member which are provided to face each other across the tape member which is conveyed in the vertical direction and configured so that the forcing member is forced to press against the separator so as to form a cut in the ACF tape by a blade of the knife member; and
a substrate holding unit for holding a substrate and positioning an electrode on an edge portion of the substrate below the pressing tool;
wherein the pressing tool and the ACF tape cutting device are linked and connected with each other by a link device, and the forcing member is caused to move relatively towards and away from the knife member by lifting up and down the pressing tool so as to form a cut, and
wherein the forcing member is a swing member which swings about a pin.

2. A tape adhering device, comprising:
a pressing tool;
a tool lifting device for lifting up and down the pressing tool;
a tape conveyor device for conveying a tape member in which a separator is adhered to one side of an ACF tape in a horizontal direction in an area lying directly below the pressing tool and conveying the tape member in a vertical direction in an area lying to a side of the pressing tool;
an ACF tape cutting device made up of a forcing member and a knife member which are provided to face each other across the tape member which is conveyed in the vertical direction and configured so that the forcing member is forced to press against the separator so as to form a cut in the ACF tape by a blade of the knife member; and
a substrate holding unit for holding a substrate and positioning an electrode on an edge portion of the substrate below the pressing tool;
wherein the pressing tool and the ACF tape cutting device are linked and connected with each other by a link device, and the forcing member is caused to move relatively towards and away from the knife member by lifting up and down the pressing tool so as to form a cut;
wherein the knife member is a fixed knife and the forcing member is a swing member which is disposed at a portion lying to a side of the pressing tool and which swings about a pin;
the link device is made up of a cam portion provided on the swing member and an abutment member provided on the pressing tool side, and
the forcing member is caused to move relatively towards and away from the blade of the knife member as a result of the abutment member being lifted up and down along the cam portion while being linked with the lifting up and down of the pressing tool so as to form the cut.

3. The tape adhering device as set forth in claim 2, wherein a separating member is provided on the swing member which is adapted to swing together with the swing member so as to separate the ACF tape adhered to the blade of the knife member from the blade in forming the cut.

4. A tape adhering method including a pressing tool, a tool lifting device for lifting up and down the pressing tool, a tape conveyor device for conveying a tape member in which a separator is adhered to one side of an ACF tape in a horizontal direction in an area lying directly below the pressing tool and conveying the tape member in a vertical direction in an area lying to a side of the pressing tool, an ACF tape cutting device made up of a forcing member and a knife member which are provided to face each other across the tape member which is conveyed in the vertical direction and configured so that the forcing member is forced to press against the separator so as to form a cut in the ACF tape by a blade of the knife member, a substrate holding unit for holding a substrate and positioning an electrode on an edge portion of the substrate below the pressing tool, and an ACF tape cutting device which is linked with the pressing tool by a link device, wherein the forcing member is a swing member which swings about a pin, the tape adhering method comprising:
causing the forcing member to move relatively towards and away from the knife member while being linked with the lifting up and down of the pressing tool so as to form the cut;
then conveying relatively a cut piece of ACF tape formed on the separator by the cut so formed to a position lying above the electrode on the edge portion of the substrate which is held by the substrate holding unit thereon, and adhering the cut piece on to the electrode by causing the pressing tool to be lifted down and up.

* * * * *